(12) United States Patent
Yang et al.

(10) Patent No.: US 12,119,222 B2
(45) Date of Patent: Oct. 15, 2024

(54) METHOD FOR PREPARING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Mengmeng Yang, Hefei (CN); Jie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 520 days.

(21) Appl. No.: 17/393,465

(22) Filed: Aug. 4, 2021

(65) Prior Publication Data
US 2022/0223412 A1 Jul. 14, 2022

Related U.S. Application Data

(63) Continuation of application No. PCT/CN2021/100190, filed on Jun. 15, 2021.

(30) Foreign Application Priority Data

Jan. 14, 2021 (CN) .................. 202110047069.X (51) Int. Cl.
H01L 21/02 (2006.01)

(52) U.S. Cl.
CPC .... *H01L 21/02304* (2013.01); *H01L 21/0214* (2013.01); *H01L 21/02164* (2013.01); *H01L 21/0217* (2013.01); *H01L 21/02236* (2013.01); *H01L 21/02255* (2013.01); *H01L 21/0228* (2013.01); *H01L 21/02332* (2013.01)

(58) Field of Classification Search
CPC .......... H01L 21/02304; H01L 21/0214; H01L 21/02164; H01L 21/0217; H01L 21/02236; H01L 21/02255; H01L 21/0228; H01L 21/02332; H01L 21/0234; H01L 21/28202; H01L 21/28211; H01L 21/28238; H01L 21/31111; H01L 29/42364; H01L 29/513; H01L 29/518; H01L 21/02238
See application file for complete search history.

(56) References Cited

U.S. PATENT DOCUMENTS 6,033,943 A * 3/2000 Gardner .......... H01L 21/823857
257/E21.639
6,114,258 A * 9/2000 Miner .................... H01L 21/022
438/770

(Continued)

FOREIGN PATENT DOCUMENTS

| CN | 1620718 A | 5/2005 |
|---|---|---|
| CN | 101271840 A | 9/2008 |

(Continued)

*Primary Examiner* — Allison Bernstein
(74) *Attorney, Agent, or Firm* — Syncoda LLC; Feng Ma (57) ABSTRACT

A method for preparing a semiconductor structure includes: providing a substrate which includes a device region and a shallow trench isolation region surrounding the device region, in which the device region is exposed from a surface of the substrate; depositing a barrier layer on the substrate, the barrier layer at least covering the device region; forming an initial oxide which is located in the device region and in contact with the barrier layer; and removing part of the initial oxide to form a device oxide.

10 Claims, 5 Drawing Sheets

(56) References Cited

U.S. PATENT DOCUMENTS

| | | | |
|---|---|---|---|
| 6,323,143 B1 * | 11/2001 | Yu | ............... H01L 21/0214 |
| | | | 438/296 |
| 6,458,717 B1 | 10/2002 | Lee | |
| 6,703,278 B2 | 3/2004 | Wieczorek | |
| 7,528,076 B2 | 5/2009 | Chan | |
| 7,741,183 B2 | 6/2010 | Luo | |
| 7,851,383 B2 | 12/2010 | Yu | |
| 2003/0157772 A1 | 8/2003 | Wieczorek | |
| 2008/0233692 A1 | 9/2008 | Yu | |
| 2009/0221120 A1 | 9/2009 | Luo | |
| 2016/0172190 A1 * | 6/2016 | Shih | ............ H01L 21/823462 |
| | | | 438/745 |

FOREIGN PATENT DOCUMENTS

| | | |
|---|---|---|
| CN | 105374734 A | 3/2016 |
| TW | I306621 B | 2/2009 |

\* cited by examiner

METHOD FOR PREPARING SEMICONDUCTOR STRUCTURE AND SEMICONDUCTOR STRUCTURE

CROSS-REFERENCE TO RELATED APPLICATIONS

The present application is a U.S. continuation application of International Application No. PCT/CN2021/100190, filed on Jun. 15, 2021, which claims priority to Chinese Patent Application No. 202110047069.X, filed on Jan. 14, 2021. International Application No. PCT/CN2021/100190 and Chinese Patent Application No. 202110047069.X are incorporated herein by reference in their entireties.

TECHNICAL FIELD

The present application relates to the field of semiconductors, and in particular to a method for preparing a semiconductor structure and a semiconductor structure.

BACKGROUND

With the continuous development of science and technology, semiconductor structures are applied more and more widely. In fields of computers, communications, etc., semiconductor structures with different functions are required. In the above-mentioned semiconductor structure, usually it is required to prepare an oxide to be used as interlayer insulation of the semiconductor structure. For example, a gate oxide is usually formed near a gate of the semiconductor structure.

The oxide is usually silicon oxide which has relatively stable chemical property and insulating property and can block the intrusion of impurities, and is widely used in the semiconductor structure. In the related art, the oxide may be formed on a substrate through an oxidation process. For example, the oxide is usually formed on the substrate by an in-situ steam generation (ISSG) process. Oxygen doped with a small amount of hydrogen is used as a reaction gas. At a high temperature, the hydrogen and the oxygen undergo a chemical reaction similar to combustion, generating a large amount of gas-phase active free radicals. The gas-phase active free radicals oxidize the substrate to form oxides.

The oxide formed by the ISSG process is generally dense and is hard to break through. However, as the size of the semiconductor structure continues to decrease, in order to obtain desired electrical performance (for example, in order to obtain a lower threshold voltage for a transistor structure), a desired thickness of the oxide also continuously decreases. However, since a reaction temperature of the ISSG process is generally high, and a film formation speed is generally high, the thickness of the oxide formed by this method is generally large, which is difficult to meet the requirements.

SUMMARY

In a first aspect, the present disclosure provides a method for preparing a semiconductor structure, including: providing a substrate which includes a device region and a shallow trench isolation region surrounding the device region, in which the device region is exposed from a surface of the substrate; depositing a barrier layer on the substrate, the barrier layer at least covering the device region; forming an initial oxide which is located in the device region and in contact with the barrier layer; and removing part of the initial oxide to form a device oxide.

In a second aspect, the present disclosure provides a semiconductor structure, including a substrate which includes a device region and a shallow trench isolation region surrounding the device region, in which the device region is exposed from a surface of the substrate; and a device oxide which is located in the device region. A thickness of the device oxide is 1 nm to 3 nm.

DETAILED DESCRIPTION

In order to make the objectives, technical solutions and advantages of the examples of the present disclosure clearer, the technical solutions in the examples of the present disclosure will be described clearly and in detail below with reference to the drawings in the examples of the present disclosure. Apparently, the examples described are part of the examples of the present disclosure, and are not all the examples. Based on the examples in present disclosure, all other examples obtained by those of ordinary skill in the art without creative work shall fall within the protection scope of the present disclosure.

A device oxide is usually provided in a semiconductor structure for interlayer insulation. For example, a gate oxide film is usually formed on a gate of a transistor element. The device oxide may be silicon oxide. A desired device oxide is generally formed by an in-situ steam generation process in the related art.

However, during forming the device oxide by the in-situ steam generation process, a reaction temperature of the in-situ steam generation process is generally relatively high, and thus a film formation speed is usually high, such that it is difficult to control a film thickness. As a result, the formed device oxide thereby is generally thicker. It is difficult to obtain a thickness below 3 nm. In addition, the formed device oxide thereby also shows relatively low performance, relatively low breakdown voltage (BV) and relatively large defect state density (DIT).

An example of the present disclosure provides a method for preparing a semiconductor structure. By forming a barrier layer covering a device region on a substrate, when an initial oxide is subsequently formed on the device region, the barrier layer can slow down the growth rate of the initial oxide to control an thickness of the initial oxide, so that an initial oxide with a smaller thickness is formed, and in turn a device oxide with a smaller thickness is formed. Further, part of the initial oxide is removed, that is, the device oxide is obtained by thinning the initial oxide, so that the thickness of the device oxide is further reduced.

Figure 1:
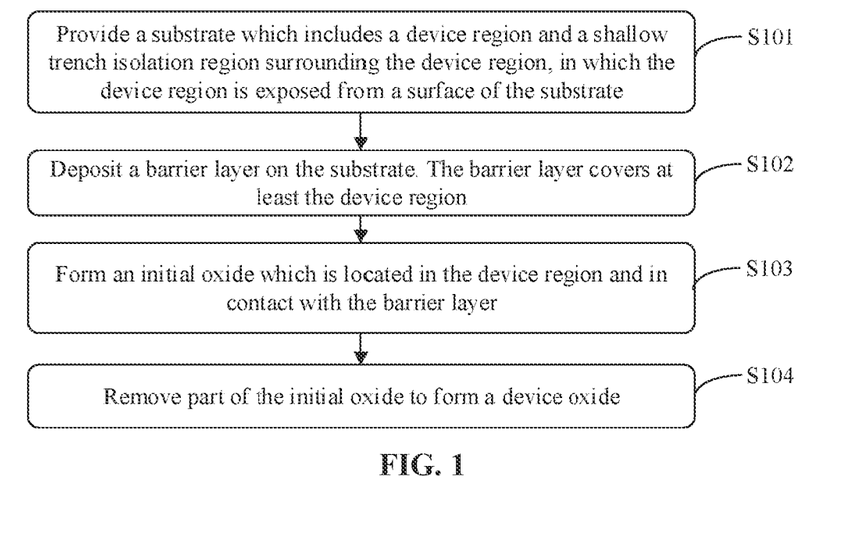
FIG. 1 is a flowchart of a method for preparing a semiconductor structure in an example of the present disclosure.

Referring to FIG. 1, a method for preparing a semiconductor structure in an example of the present disclosure is illustrated. The method for preparing a semiconductor structure can be used to prepare a device oxide with a smaller thickness, which specifically includes the following steps.

At S101: a substrate is provided. The substrate includes a device region and a shallow trench isolation region surrounding the device region, in which the device region is exposed from a surface of the substrate.

Figure 2:
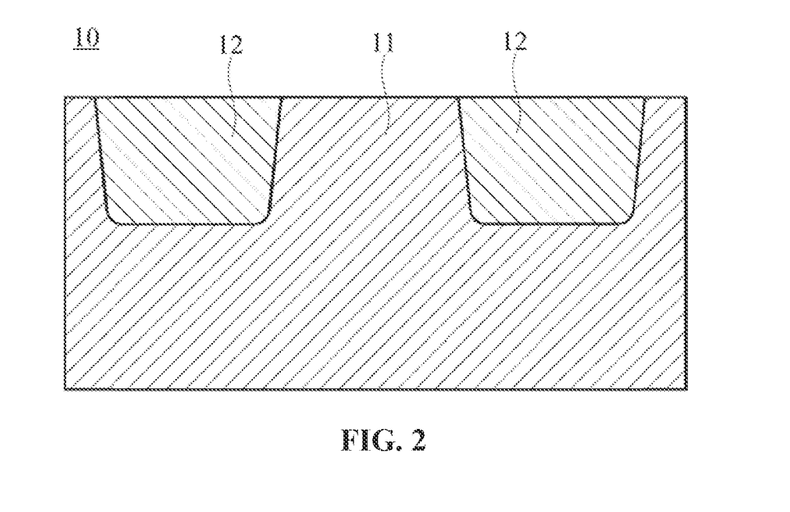
FIG. 2 is a schematic structural diagram of a substrate in an example of the present disclosure.

Referring to FIG. 2, the substrate 10 includes the device region 11 and the shallow trench isolation (STI) region 12. The STI region 12 may be disposed around the device region 11 to isolate and protect elements in the device region 11. Exemplarily, the STI region 12 may isolate and protect a metal oxide semiconductor (MOS) transistor formed in the device region.

In some possible examples, the STI region 12 may be formed by etching the substrate 10 to form a trench structure, filling the trench structure with an oxide, planarizing the filled oxide, etc. A material of the STI region 12 may include silicon oxide ($SiO_2$) or hafnium oxide ($HfO_2$). The examples of the present disclosure do not limit this.

Referring to FIG. 2 again, an upper surface of the device region 11 may be flush with an upper surface of the STI region 12, so that the device region 11 is exposed from the surface of the substrate 10 to facilitate oxidation of the device region 11. A material of the device region 11 may include silicon (Si) or hafnium (Hf), etc. such as monocrystalline silicon or polycrystalline silicon. The device oxide 40 may include silicon oxide, hafnium oxide, or the like.

For the convenience of description, the examples of the present disclosure and the following examples are described in detail, with the material of the device region 11 being silicon and the material of the STI region 12 being silicon oxide as an example.

At S102: a barrier layer is deposited on the substrate. The barrier layer covers at least the device region.

Figure 3:
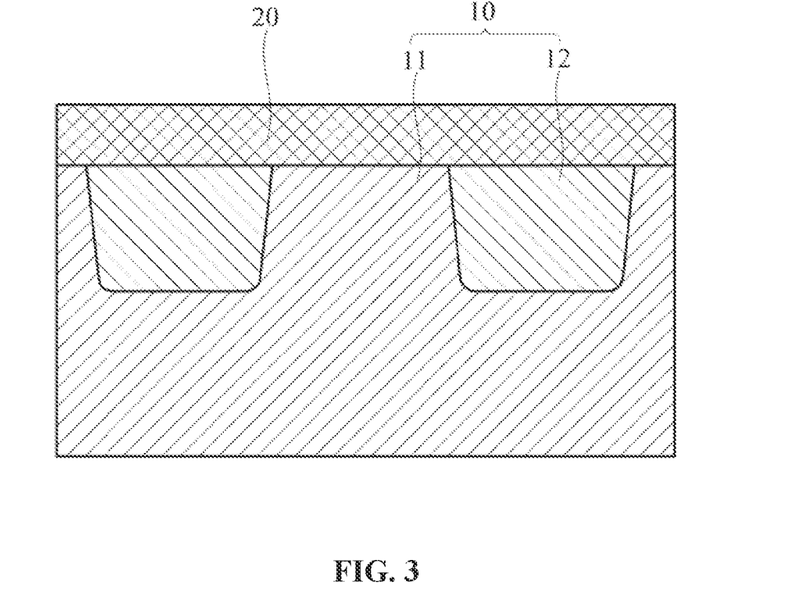
FIG. 3 is a schematic structural diagram after a barrier layer is formed in an example of the present disclosure.

In some possible examples, the barrier layer 20 is formed on the substrate 10 by a deposition process. For example, the barrier layer 20 as shown in FIG. 3 is formed on the substrate 10 by a chemical vapor deposition (CVD) process, a physical vapor deposition (PVD) process, or an atomic layer deposition (ALD) process. In the examples of the present disclosure, the barrier layer 20 is deposited on the substrate 10 by the ALD process. The barrier layer 20 formed thereby has a uniform thickness and good consistency. In the subsequent formation of the device oxide, the thickness of the device oxide can be well controlled.

The barrier layer 20 covers the device region 11. Shielding the device region 11 can isolate some oxygen. The barrier layer 20 may only cover the device region 11, that is, the barrier layer 20 is facing the device region 11. The barrier layer 20 may cover the substrate 10 entirely, that is, the barrier layer 20 is facing the substrate 10. As shown in FIG. 3, the barrier layer 20 is formed on an entire upper surface of the substrate 10.

The barrier layer 20 may be a silicon nitride (SiN) layer or a silicon oxynitride (SiON) layer. For example, the barrier layer 20 in the example of the present disclosure is a silicon nitride layer. The thickness of the barrier layer 20 may be 5 nm to 10 nm, by which the barrier layer 20 has a relatively low internal stress and a relatively good barrier effect. If the thickness of the barrier layer 20 is too small, the thickness of the initial oxide to be formed subsequently will be too large, which will not meet the requirements. Moreover, a nitrogen element will penetrate into the substrate 10 during subsequent nitridation. If the thickness of the barrier layer 20 is too large, the thickness of the initial oxide to be formed subsequently will be too small, and it is not easy to control the thickness of the device oxide to be formed finally. Moreover, a concentration of the nitrogen element doped into the initial oxide will be too small to meet device requirements.

It should be noted that the barrier layer 20 can be of a single-layer structure as shown in FIG. 3, or a multi-layer structure. The examples of the present disclosure do not limit this. Exemplarily, the barrier layer 20 may include a silicon nitride layer and/or a silicon oxynitride layer that are stacked.

At S103: an initial oxide is formed, which is located in the device region and in contact with the barrier layer.

Figure 4:
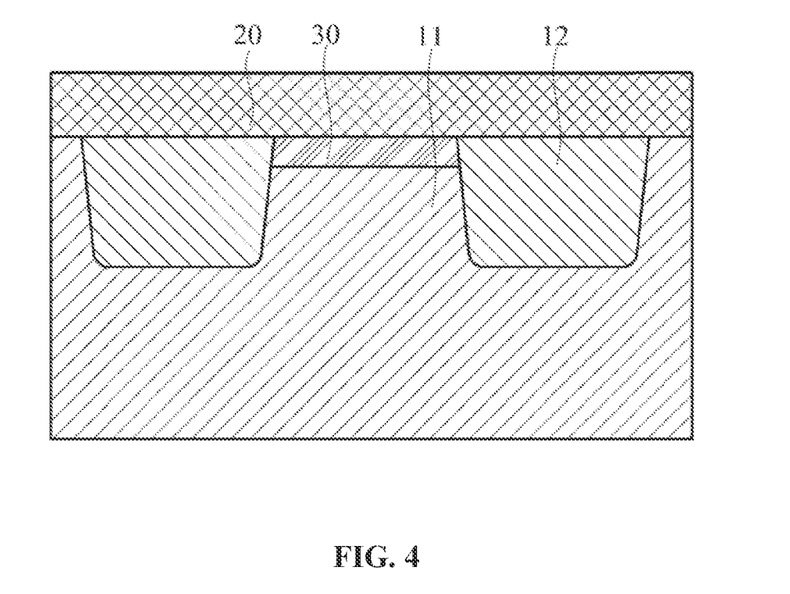
FIG. 4 is a schematic structural diagram after an initial oxide is formed in an example of the present disclosure.

The initial oxide 30 may be silicon oxide, and may be formed by oxidizing the device region 11. In some possible examples, the device region 11 is thermally oxidized by an in-situ steam generation process, so that a part of the device region 11 close to the barrier layer 20 is converted into an oxide to form the initial oxide 30. The formed initial oxide 30 is located in the device region 11 and in contact with the barrier layer 20. As shown in FIG. 4, an upper part of the device region 11 is oxidized to form the initial oxide 30.

During forming the initial oxide 30 through the ISSG process, a temperature of the process may be 1000° C. to 1500° C., so that the formed initial oxide 30 has a denser structure and better performance. An oxidizing gas can be oxygen ($O_2$), an oxygen-containing mixture, nitrogen monoxide ($N_2O$), or a nitrogen monoxide-containing mixture. Of course, the examples of the present disclosure are not limited to this. The initial oxide 30 in the example of the present disclosure may also be formed by other oxidation processes.

In the above-mentioned process, the device region 11 is shielded by the barrier layer 20, which can slow down the growth rate of the initial oxide 30 and facilitate control of the thickness of the initial oxide 30. In this way, a relatively thin initial oxide 30 will be formed, so that the device oxide 40 to be formed finally is relatively thin.

It can be understood that the growth rate of the initial oxide 30 depends on the thickness of the barrier layer 20. The greater the thickness of the barrier layer 20 is, the slower the growth rate of the initial oxide 30 is. In contrary, the smaller the thickness of the barrier layer 20 is, the faster the growth rate of the initial oxide 30 is.

In the example of the present disclosure, the growth rate of the initial oxide 30 can be controlled by adjusting the thickness of the barrier layer 20, so as to form the initial oxide 30 with a relatively small thickness. Exemplarily, the thickness of the initial oxide 30 may be less than or equal to 6 nm. By such a setting, in the subsequent process of forming the device oxide, the device oxide with a desired thickness can be obtained by removing less of the initial oxide 30, so that it is easier to control a thickness of a device oxide.

It should be noted that the initial oxide 30 is formed between the two STI regions 12 as shown in FIG. 4. The initial oxide 30 may also be formed on the outer sides of the two STI regions 12 as shown in FIG. 4. That is, the initial oxides 30 may also be formed in the substrate parts at the left and right sides.

At S104: part of the initial oxide is removed to form a device oxide.

In the example of the present disclosure, part of the initial oxide 30 is removed to further thin the initial oxide 30. The device oxide 40 is formed by removing part of the initial oxide 30. The device oxide 40 formed thereby is relatively thin.

Figure 5:
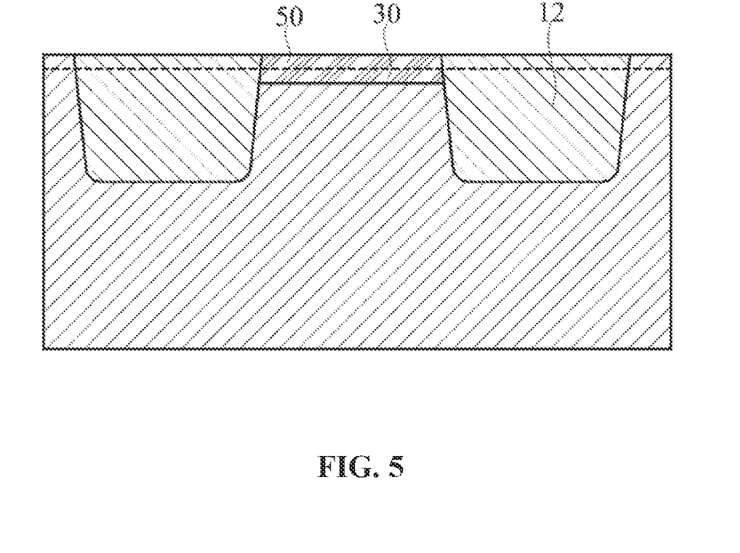
FIG. 5 is a schematic structural diagram of a removal layer in an example of the present disclosure.
Figure 6:
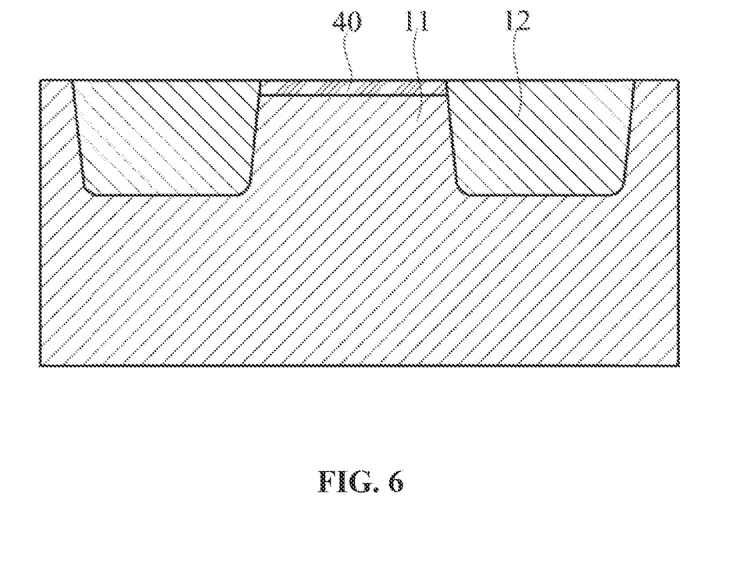
FIG. 6 is a schematic structural diagram after part of an initial oxide is removed in an example of the present disclosure.

In some possible examples, a part of the initial oxide 30 which is far away from the substrate 10 is removed. As shown in FIG. 5, the part of the initial oxide 30 above the dotted line is removed, that is, the substrate above the dotted line shown in FIG. 5 is a removal layer 50 to be removed. As shown in FIG. 6, the device oxide 40 is formed after removing part of the initial oxide 30. The thickness of the device oxide 40 may be 1 nm to 3 nm, which is relatively small.

In the example of the present disclosure, part of the initial oxide 30 may be removed by wet etching. Illustratively, an etching solution is a dilute hydrofluoric acid (DHF) solution. In the DHF solution, a mass ratio of hydrofluoric acid (HF) to deionized water (DIW) ranges from 1:500 to 1:2000. Use of the low-concentration DHF solution can reduce or avoid a damage to a part of the device region 11 located below the initial oxide 30 by the DHF solution.

In the method for preparing a semiconductor structure provided by the examples of the present disclosure, the substrate 10 is firstly provided. The substrate 10 includes the device region 11 and the STI region 12. The STI region 12 is arranged around the device region 11. The device region 11 is exposed from the surface of the substrate 10 to facilitate subsequent formation of the device oxide 40 in the device region 11. The barrier layer 20 is then deposited on the substrate 10, and covers at least the device region 11, so that the barrier layer 20 shields the device region 11. Next, the initial oxide 30 is formed. The initial oxide 30 is located in the device region 11 and in contact with the barrier layer 20. Due to the shielding of the barrier layer 20 to the device region 11, the growth rate of the initial oxide 30 can be slowed down, and it is convenient to control the thickness of the initial oxide 30. A relatively thin initial oxide 30 is thus formed. That is, the initial oxide 30 is relatively thin. By such a setting, in the subsequent process of forming the device oxide, the device oxide 40 with a desired thickness can be obtained by removing less of the initial oxide 30, so that it is easier to control the thickness of the device oxide 40. Part of the initial oxide 30 is then removed to form the device oxide 40. The thickness of the device oxide 40 to be formed finally will be further reduced by thinning the initial oxide 30, so that the thickness of the device oxide 40 is relatively small.

Figure 7:
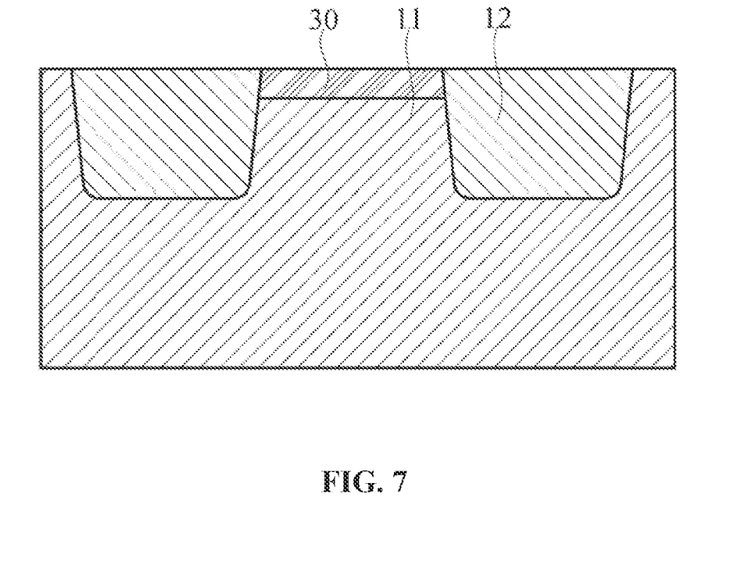
FIG. 7 is a schematic structural diagram after the barrier layer is removed in an example of the present disclosure.

Referring to FIG. 7, after the step of forming the initial oxide 30 and before the step of removing part of the initial oxide 30, the method for preparing a semiconductor structure in the example of the present disclosure further includes: the barrier layer 20 is removed by an etching process.

By such a setting, the substrate 10 and the initial oxide 30 formed in the substrate 10 can be exposed, so that the initial oxide 30 can be subsequently treated. The barrier layer 20 may be removed by etching. For example, the above-mentioned barrier layer 20 may be removed by dry etching or wet etching.

When the barrier layer 20 is a silicon oxynitride layer, in some possible examples, the barrier layer 20 may be dry-etched by using a fluorine-containing gas as the etching gas. For example, the etching gas may be carbon tetrafluoride ($CF_4$).

After the step of forming the initial oxide 30 and before the step of removing the barrier layer 20 by an etching process, the method for preparing a semiconductor structure in the example of the present disclosure further includes: the initial oxide 30 is nitrided.

In some possible examples, the initial oxide 30 may be subjected to remote plasma nitridation (RPN) using microwaves, or decoupled plasma nitridation (DPN) using radio frequency, so as to form an initial oxide 30 doped with nitrogen ions.

By nitridation of the initial oxide 30, on the one hand, electrical properties of the initial oxide 30 can be adjusted. For example, the initial oxide 30 can obtain a higher dielectric constant, so that a threshold voltage of a transistor device may be lower in case that the device oxide to be formed finally has the same thickness. On the other hand, when the initial oxide 30 is subsequently thinned by dry etching, an etching rate can be reduced, and an etching thickness of the initial oxide 30 can be better controlled, so as to reduce the risk of etching through of the initial oxide 30 or prevent the initial oxide 30 from being etched through to damage the device region 11.

Figure 8:
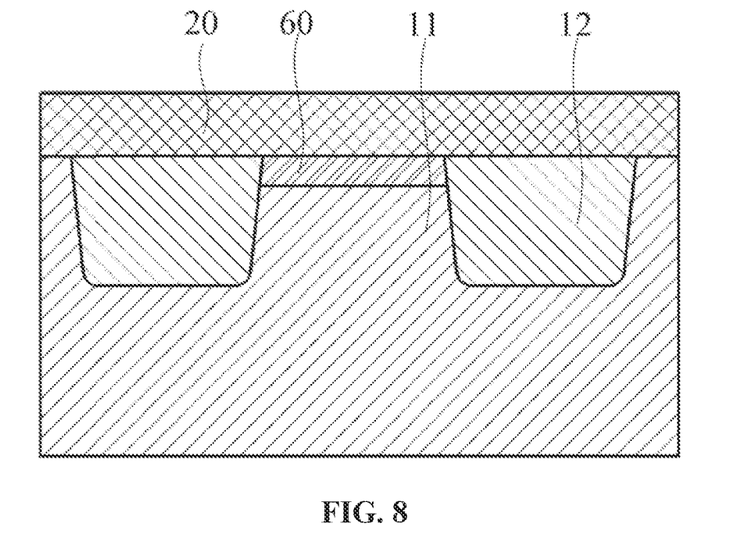
FIG. 8 is a schematic structural diagram after a nitriding layer is formed in an example of the present disclosure.
Figure 9:
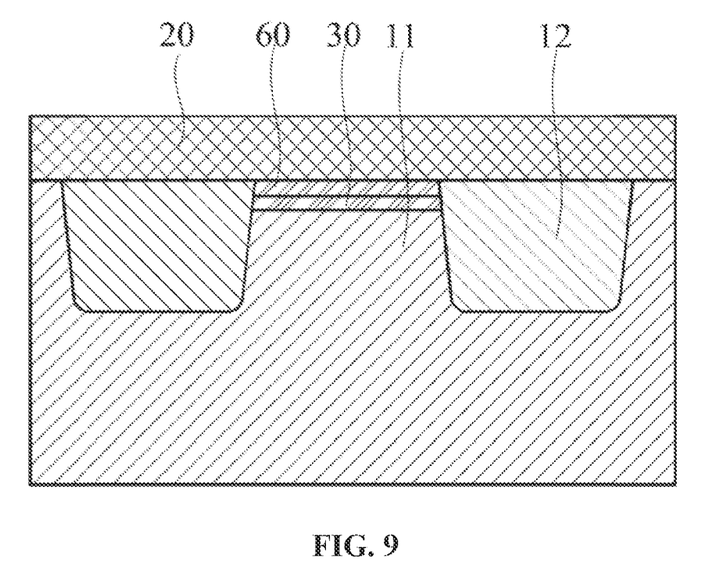
FIG. 9 is a schematic structural diagram after part of a nitriding layer is formed in an example of the present disclosure.

It should be noted that, as shown in FIG. 8, the entire initial oxide 30 can be nitrided. That is, the entire initial oxide 30 is converted into a nitriding layer 60. As shown in FIG. 9, part of the initial oxide 30 can also be nitrided. That is, the initial oxide 30 located at an upper part is converted into the nitriding layer 60. The examples of the present disclosure do not limit this.

When the initial oxide 30 is nitrided, nitrogen ions infiltrate into the initial oxide 30 with a nitriding energy and a nitriding concentration adjusted by the barrier layer 20 formed on the substrate 10. In the nitriding process, the barrier layer 20 may block part of nitrogen ions to control a penetration depth of the nitrogen ions, thereby facilitating the control of a thickness of the nitriding layer 60 and avoiding the nitrogen ions from damaging the part in the device region 11 located below the initial oxide 30.

Referring to FIG. 6, a schematic structural diagram of a semiconductor structure in an example of the present disclosure is illustrated. The semiconductor structure includes a substrate which includes a device region 11 and a shallow trench isolation (STI) region 12. The STI region 12 may be arranged around the device region 11, in order to isolate and protect the device region 11 where a device oxide 40 is formed.

The device oxide 40 is exposed from an upper surface of the substrate. A thickness of the device oxide 40 may be 1 nm to 3 nm, which is relatively small. A material of the device region 11 may include silicon. A material of the STI region 12 may include silicon oxide. A material of the device oxide 40 may include silicon oxide.

In some possible examples, the device oxide 40 may be formed by the following steps. A substrate is provided. The substrate includes a device region 11 and an STI region 12 surrounding the device region 11, in which the device region is exposed from a surface of the substrate. A barrier layer is deposited on the substrate, and at least covers the device region 11. An initial oxide is formed, which is located in the device region 11 and in contact with the barrier layer. Part of the initial oxide is removed to form the device oxide.

By shielding the device region 11 with the barrier layer, a growth rate of the initial oxide can be slowed down, and the initial oxide with a smaller thickness can be formed, so that the thickness of the device oxide 40 to be formed finally is smaller. Moreover, part of the initial oxide is removed to thin the initial oxide, and thus the thickness of the device oxide 40 to be formed finally will be further reduced, so that the thickness of the device oxide 40 is relatively small.

It should be noted that the semiconductor structure in the example of the present disclosure may further include a nitriding layer 60. Exemplarily, the device oxide 40 is the nitriding layer 60. That is, the entire device oxide 40 is nitrided to form the nitriding layer 60. Alternatively, the nitriding layer 60 is provided on the device oxide 40. That is, part of the device oxide 40 is nitrided to form the nitriding layer 60. As shown in FIG. 9, an upper part of the device oxide 40 is nitrided to form the nitriding layer 60.

The semiconductor structure in the example of the present disclosure includes the substrate 10 which includes the device region 11 and the STI region 12 surrounding the device region 11. The device oxide 40 is formed in the device region 11. The thickness of the device oxide 40 is 1 nm to 3 nm, which is relatively small, so that the semiconductor structure has the advantage that the device oxide 40 has a relatively small thickness.

All the examples in the present specification are described in a progressive manner Contents mainly described in each example are different from those described in other examples. Same or similar parts of all the examples may refer to each other.

Those skilled in the art should understand that in the present disclosure, the orientation or positional relationships indicated by terms "longitudinal", "lateral", "upper", "lower", "front", "rear", "left", "right" and "vertical", "horizontal", "top", "bottom", "inner", "outer", etc. are based on the orientations or positional relationships shown in the drawings, which are only for the convenience of describing the present disclosure and simplifying the description, rather than indicating or implying that the system or element referred to must have a specific orientation or be constructed and operated in a specific orientation. So the above terms should not be construed as limiting the present disclosure.

In the description of the present specification, descriptions of the reference terms such as "one embodiment", "some embodiments", "illustrative embodiments", "examples", "specific examples", or "some examples" mean that specific features, structures, materials or characteristics described in connection with the embodiments or examples are included in at least one embodiment or example of the present disclosure. In the present specification, the schematic representations of the above terms do not necessarily refer to the same embodiment or example. Moreover, the described specific features, structures, materials or characteristics may be combined in any one or more embodiments or examples in an appropriate manner.

Finally, it should be noted that the various above examples are only used to describe the technical solutions of the present disclosure, and not intended to limit the present disclosure. Although the present disclosure has been described in detail with reference to the foregoing examples, those skilled in the art should understand that they can further modify the technical solutions described in all the foregoing examples, or equivalently replace some or all of the technical features. These modifications or replacements do not cause the essences of the corresponding technical solutions depart from the spirit and scope of the technical solutions of the examples of the present disclosure.

The invention claimed is:

1. A method for preparing a semiconductor structure, comprising: providing a substrate which comprises a device region and a shallow trench isolation region surrounding the device region, wherein the device region is exposed from a surface of the substrate; depositing a barrier layer on the substrate, wherein the barrier layer covers at least the device region, and a thickness of the barrier layer is 5 nm to 10 nm; thermally oxidizing part of the substrate in the device region by an in-situ steam generation process to form an initial oxide which is located between a remaining part of the substrate in the device region and the barrier layer, and in contact with the barrier layer; and removing the barrier layer by using an etching process; and removing part of the initial oxide and a remaining part of the initial oxide being formed as a device oxide, wherein a thickness of the initial oxide is less than or equal to 6 nm and a thickness of the device oxide is 1 nm to 3 nm.

2. The method for preparing a semiconductor structure of claim 1, wherein the device oxide is silicon oxide.

3. The method for preparing a semiconductor structure of claim 1, wherein a temperature of the in-situ steam generation process is 1000° C. to 1500° C.

4. The method for preparing a semiconductor structure of claim 1, wherein after the step of forming an initial oxide, and before the step of removing the barrier layer by using an etching process, the method further comprises:
    nitriding the initial oxide.

5. The method for preparing a semiconductor structure of claim 1, wherein the step of removing part of the initial oxide comprises:
    removing part of the initial oxide which is far away from the substrate by using a dilute hydrofluoric acid solution.

6. The method for preparing a semiconductor structure of claim 5, wherein a mass ratio of hydrofluoric acid to deionized water in the dilute hydrofluoric acid solution ranges from 1:500 to 1:2000.

7. The method for preparing a semiconductor structure of claim 1, wherein the barrier layer is a silicon nitride layer or a silicon oxynitride layer.

8. The method for preparing a semiconductor structure of claim 1, wherein the step of depositing a barrier layer on the substrate comprises:
    depositing the barrier layer on the substrate by an atomic layer deposition process.

9. The method for preparing a semiconductor structure of claim 1, wherein a material of the shallow trench isolation region comprises silicon oxide.

10. A semiconductor structure prepared with the method of claim 1, comprising:
    the substrate which comprises the device region and the shallow trench isolation region surrounding the device region, wherein the device region is exposed from the surface of the substrate; and
    the device oxide which is located in the device region.

* * * * *